(12) United States Patent
Cho

(10) Patent No.: US 8,557,663 B2
(45) Date of Patent: Oct. 15, 2013

(54) METHOD FOR MANUFACTURING SEMICONDUCTOR DEVICE WITH VERTICAL GATE TRANSISTOR

(75) Inventor: Heung-Jae Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/338,648

(22) Filed: Dec. 28, 2011

(65) Prior Publication Data

US 2013/0109165 A1 May 2, 2013

(30) Foreign Application Priority Data

Oct. 31, 2011 (KR) .................. 10-2011-0111835

(51) Int. Cl.
*H01L 29/732* (2006.01)
*H01L 21/331* (2006.01)
*H01L 21/8224* (2006.01)

(52) U.S. Cl.
USPC .................. 438/270; 438/156; 438/192

(58) Field of Classification Search
None
See application file for complete search history.

(56) References Cited

U.S. PATENT DOCUMENTS

2011/0104894 A1* 5/2011 Kim et al. .............. 438/666

* cited by examiner

*Primary Examiner* — Zandra Smith
*Assistant Examiner* — Pamela E Perkins
(74) *Attorney, Agent, or Firm* — IP & T Group LLP

(57) ABSTRACT

A method for manufacturing a semiconductor device includes forming a plurality of pillars by etching a semiconductor substrate, forming a gate dielectric layer on sidewalls of the pillars and on surfaces of the semiconductor substrate between the pillars, forming an implant damage in a portion of the gate dielectric layer between two pillars by implanting ions into the portion of the gate dielectric layer, forming vertical gates to cover the sidewalls of the pillars, and removing the implant damage.

18 Claims, 9 Drawing Sheets

METHOD FOR MANUFACTURING SEMICONDUCTOR DEVICE WITH VERTICAL GATE TRANSISTOR

CROSS-REFERENCE TO RELATED APPLICATIONS

The present application claims priority of Korean Patent Application No. 10-2011-0111835, filed on Oct. 31, 2011, which is incorporated herein by reference in its entirety.

BACKGROUND

1. Field

Exemplary embodiments of the present invention relate to a method for manufacturing a semiconductor device, and more particularly, to a method for manufacturing a semiconductor device with a vertical gate transistor.

2. Description of the Related Art

In a semiconductor device, to achieve a high density and a short channel margin, transistors with a three-dimensional structure may be implemented. Among these transistors, a vertical gate transistor with a vertical channel has been used in the semiconductor device.

In a vertical gate transistor, since a channel is formed in a vertical direction with respect to a substrate, a gate dielectric layer and gate electrodes are also formed in the vertical direction. To separate the gate electrodes, dry etching is performed using spacers. The gate electrodes are referred to as vertical gates.

FIGS. 1A and 1B are views illustrating a conventional method for manufacturing a vertical gate transistor.

Referring to FIG. 1A, a plurality of pillars 12 are formed by etching a semiconductor substrate 11. A hard mask layer 13 is used as an etch barrier to form the pillars 12. The pillars 12 become vertical channels.

A gate dielectric layer 14 is formed on the surfaces of the pillars 12. Subsequently, a conductive layer 15, which is to be used as gate electrodes, is formed on the entire surface including the gate dielectric layer 14. The conductive layer 15 is formed to gap-fill the spaces between the pillars 12. Subsequently, planarization and etch-back processes are performed.

A dielectric layer to be used as spacers 16 is formed on the conductive layer 15. After performing spacer etching, the conductive layer 15 is etched using the spacers 16 as an etch barrier. As a result, vertical gates are formed. When etching the conductive layer 15, dry etching, for example, plasma etching, is used.

FIG. 1B illustrates the semiconductor device after etching of the conductive layer 15 is completed and vertical gates 15A are formed.

However, in the conventional art, electron shadowing 17 occurs at the top of a narrow trench between the pillars 12 by an ion sheath under a plasma atmosphere. As a result, electrons may not reach the bottom of the trench. Positive ions 18 move to the bottom of the trench due to an attractive force. Therefore, damage may occur at the gate dielectric layer 14 as a result of the collection of positive ions 18 at the bottom of the gap. More specifically, a plasma-induced damage (PID) occurs due to a structural aspect. In particular, since the thickness of the gate dielectric layer 14 is thinnest on an edge 19 of the lower end of each pillar 12, degradation due to the plasma-induced damage may become serious at the edge 19.

SUMMARY

An embodiment of the present invention is directed to a method for manufacturing a semiconductor device that can prevent a plasma-induced damage (PID).

In accordance with an embodiment of the present invention, a method for manufacturing a semiconductor device includes: forming a plurality of pillars by etching a semiconductor substrate; forming a gate dielectric layer on sidewalls of the pillars and on surfaces of the semiconductor substrate between the pillars; forming an implant damage in a portion of the gate dielectric layer between two pillars by implanting ions into the portion of the gate dielectric layer; forming vertical gates to cover the sidewalls of the pillars; and removing the implant damage.

In accordance with another embodiment of the present invention, a method for manufacturing a semiconductor device includes: forming a plurality of pillars by etching a semiconductor substrate; forming a gate dielectric layer on sidewalls of the pillars and on surfaces of the semiconductor substrate between the pillars; forming a conductive layer that gap-fills trenches between the pillars, wherein the upper surface of the conductive layer is formed to a height lower than the upper surface of the pillars; forming a spacer dielectric layer on an entire surface including the conductive layer and the pillars; forming an implant damage in a portion of the gate dielectric layer between two pillars by implanting ions into the portion of the gate dielectric layer; forming vertical gates by sequentially performing etching of the spacer dielectric layer and etching of the conductive layer; and removing the implant damage.

In accordance with yet another embodiment of the present invention, a method for manufacturing a semiconductor device includes: forming a plurality of pillars by etching a semiconductor substrate; forming a gate dielectric layer on sidewalls of the pillars and on surfaces of the semiconductor substrate between the pillars; removing a portion of the gate dielectric layer that is formed between adjacent pillars; forming a conductive layer that gap-fills trenches between the pillars, wherein the upper surface of the conductive layer is formed to a height lower than the upper surface of the pillars; forming a spacer dielectric layer on an entire surface including the conductive layer and the pillars; and forming vertical gates by sequentially performing etching of the spacer dielectric layer and etching of the conductive layer.

DETAILED DESCRIPTION

Figure 1A:
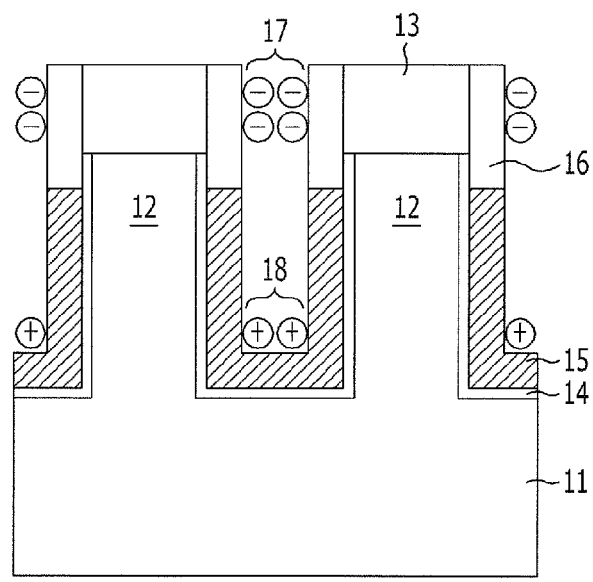
FIGS. 1A and 1B are views illustrating a conventional method for manufacturing a vertical gate transistor.
Figure 1B:
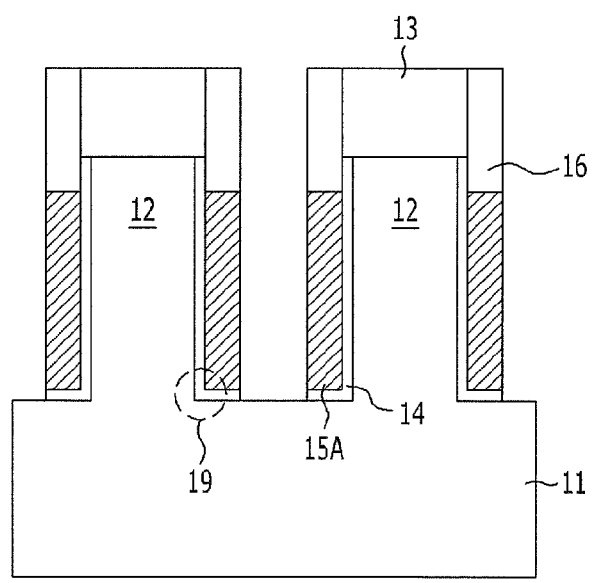

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The present invention proposes a method for preventing plasma-induced damage (PID) from occurring in a three-dimensional structure. To prevent charging from occurring on a gate dielectric layer by ions, a current path is formed in a portion of the gate dielectric layer.

FIGS. 2A to 2E are views illustrating a method for manufacturing a vertical gate transistor in accordance with a first embodiment of the present invention.

Figure 2A:
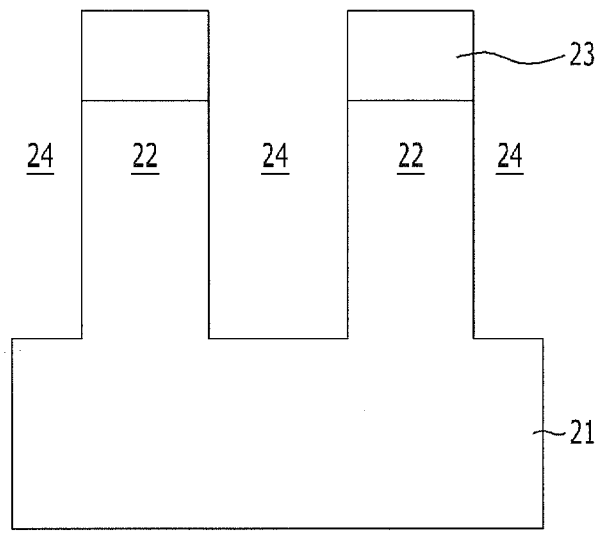
FIGS. 2A to 2E are views illustrating a method for manufacturing a vertical gate transistor in accordance with a first embodiment of the present invention.

Referring to FIG. 2A, a plurality of pillars 22 are formed by etching a semiconductor substrate 21. A hard mask layer 23 is used as an etch barrier to form the pillars 22. The pillars 22 serve as vertical channels. The semiconductor substrate 21 is formed of a silicon-based material. For example, the semiconductor substrate 21 may include a silicon substrate, a silicon-germanium, and a silicon carbide. Accordingly, the pillars become silicon pillars. The pillars 22 become the channels of vertical gate transistors, and in particular, provide vertical channels. The plurality of pillars 22 are separated from one another by a plurality of trenches 24. The pillars 22 are line type pillars. A dielectric layer such as a silicon nitride layer and a silicon oxide layer may be used as the hard mask layer 23. The hard mask layer 23 may have a multi-layered structure.

Figure 2B:
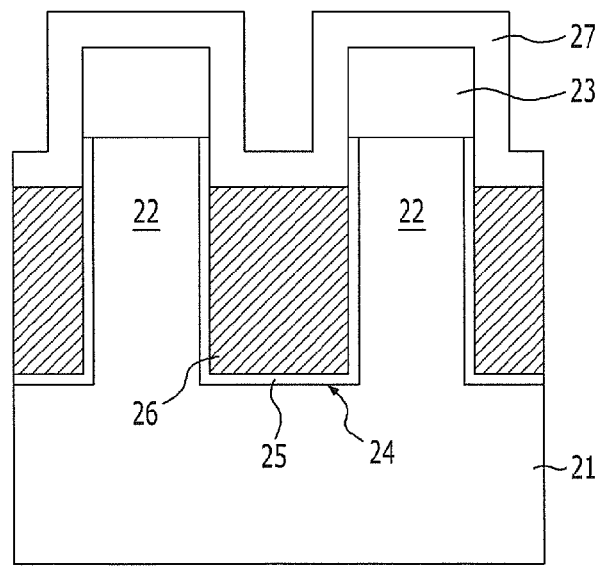

Referring to FIG. 2B, a gate dielectric layer 25 is formed on the bottoms of the trenches 24 and the sidewalls of the pillars 22. The gate dielectric layer 25 may be formed through a thermal oxidation process. In another embodiment, the gate dielectric layer 25 may be formed using a deposition method such as CVD (chemical vapor deposition) and ALD (atomic layer deposition). The gate dielectric layer 25 may include a silicon oxide layer ($SiO_2$). The gate dielectric layer 25 may also include a substance with a high dielectric constant.

Subsequently, a conductive layer 26 is formed on the entire surface including the gate dielectric layer 25. The conductive layer 25 is formed to gap-fill the trenches 24 between the pillars 22. Subsequently, planarization and etch-back processes are performed. As a result, the conductive layer 26 remains between the pillars 22 while having a height lower than the top surfaces of the pillars 22. The conductive layer 26 is to form gate electrodes, or more specifically, vertical gates, and may include polysilicon or a metal layer. The metal layer may include a titanium nitride layer (TiN), tungsten (W), etc. or may be formed by stacking a titanium nitride layer (TiN) and a tungsten layer (W). Also, the conductive layer 26 may be formed by stacking a barrier metal and a low-resistance metal layer. For example, the conductive layer 26 may be formed by the stack of Ti/TiN/W.

A spacer dielectric layer 27 is formed on the conductive layer 26 to be used as spacers. The spacer dielectric layer 27 may include a nitride layer such as a silicon nitride layer.

Figure 2C:
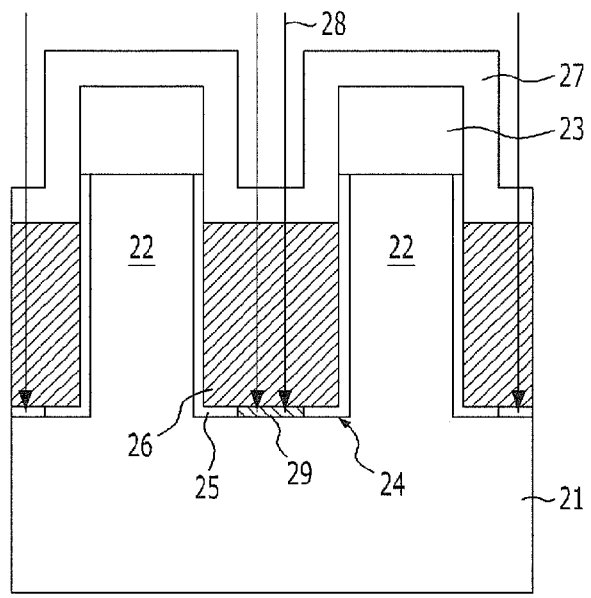

Referring to FIG. 2C, ion implantation 28 is directionally implemented such that ion implantation energy is controlled to pass through the conductive layer 26 and implant ions into a portion of the gate dielectric layer 25 that is formed on the bottom of the trench 24 between two pillars 22. Therefore, implant damage 29 occurs in the portion of the gate dielectric layer 25 after the ion implantation 28 is implemented. The ion implantation 28 is implemented by using an inactive element such as Ne, Ar, Kr, Xe and Rn or a third or fifth group element as a dopant. As a third group element, boron (B) is used. As a fifth group element, phosphor (P), arsenic (As), or antimony (Sb) is used. By the ion implantation, the implant damage 29 may selectively occur in the portion of the gate dielectric layer 25 that is formed on the bottom of the trench 24.

By forming the implant damage 29 as described above, ion charging that occurs in subsequent gate etching is discharged through the implant damage 29 of the gate dielectric layer 25. More specifically, charging damage does not result. Since the implant damage 29 of the gate dielectric layer 25 is removed when etching the conductive layer 26, the implant damage 29 by the ion implantation 28 may be effectively used.

When implementing the ion implantation 28, to selectively open the gate dielectric layer 25 between the pillars 22, a separate ion implantation mask M/K may be employed. The ion implantation mask M/K is formed using a photoresist layer.

Figure 3A:
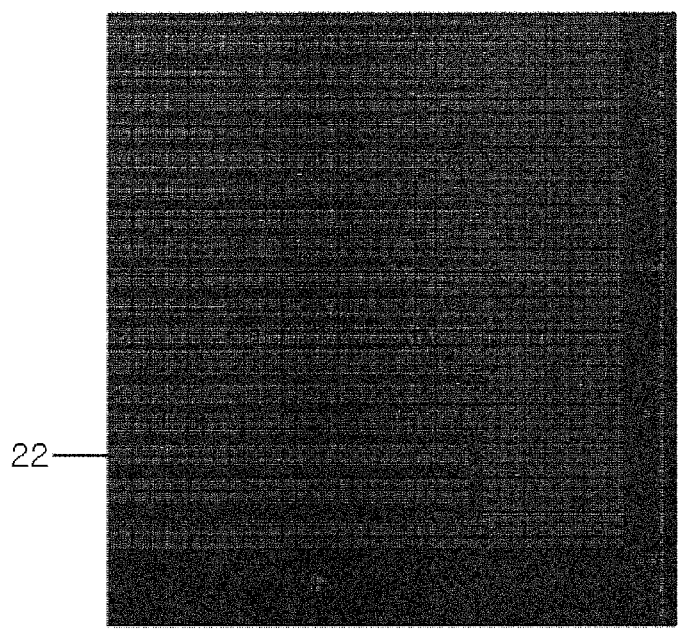
FIG. 3A is a plan view illustrating a pillar in accordance with the first embodiment of the present invention.
Figure 3B:
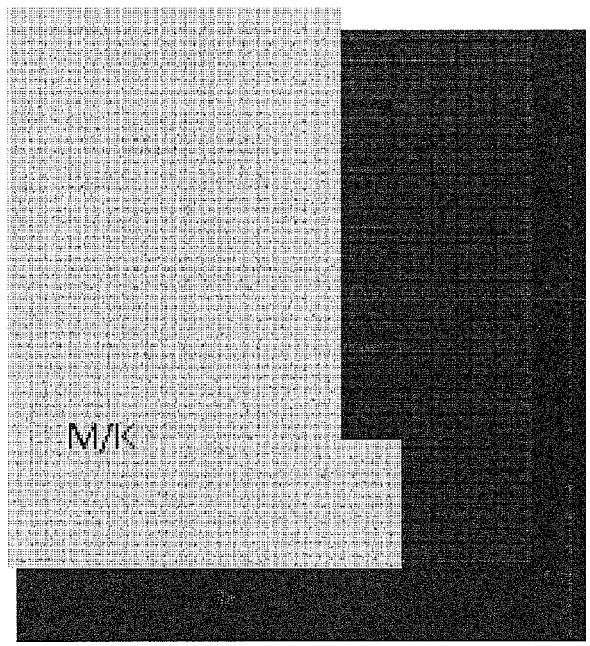
FIG. 3B is a plan view illustrating an ion implantation mask in accordance with the first embodiment of the present invention.

FIG. 3A is a plan view illustrating a pillar in accordance with the first embodiment of the present invention, and FIG. 3B is a plan view illustrating an ion implantation mask in accordance with the first embodiment of the present invention. Referring to FIG. 3B, the ion implantation mask M/K opens a first side ends of the pillars 22. The pillars 22 may be connected with one another at the first side ends thereof, and the first side end portions of the pillars 22 are opened.

Figure 2D:
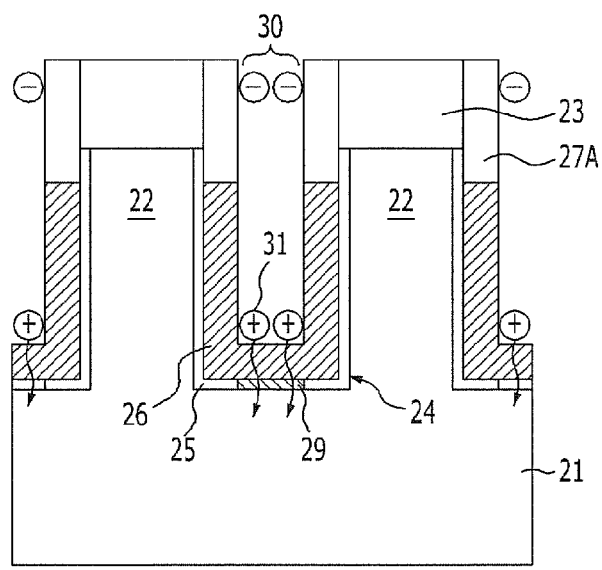
Figure 2E:
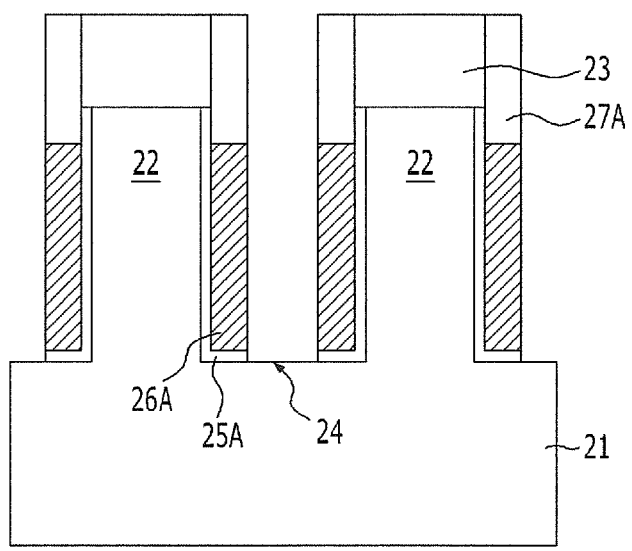

As shown in FIGS. 2D and 2E, spacers 27A are formed by performing spacer etching. Subsequently, gate etching is performed by using the spacers 27A as an etch barrier. For example, the conductive layer 26 is dry-etched using the spacers 27A as an etch barrier. As a result, vertical gates 26A are formed. When etching the conductive layer 26, dry etching, for example, plasma etching, is used.

Referring to FIG. 2D, when plasma-etching the conductive layer 26, electron shadowing 30 occurs at the top of the trenches 24 by an ion sheath under a plasma atmosphere. Positive ions 31 move to the bottom of the trenches 24 due to an attractive force. Therefore, damage may occur at the gate dielectric layer 25 as a result of the collection of positive ions 18 at the bottom of the trench 24. In the embodiment of the present invention, since the implant damage 29 is formed in the portion of the gate dielectric layer 25, ion charging occurring during gate etching is discharged through the implant damage 29 of the gate dielectric layer 25. Thus, since a charging damage does not occur, a plasma-induced damage (PID) may be prevented.

Next, after forming the vertical gates 26A, the implant damage 29 of the exposed gate dielectric layer 25 is selectively removed. As a result, a portion of the bottom of each trench 24 is exposed. The gate dielectric layer that is not etched remains as indicated by the reference numeral 25A.

FIGS. 4A to 4E are views illustrate a method for manufacturing a vertical gate transistor in accordance with a second embodiment of the present invention.

Figure 4A:
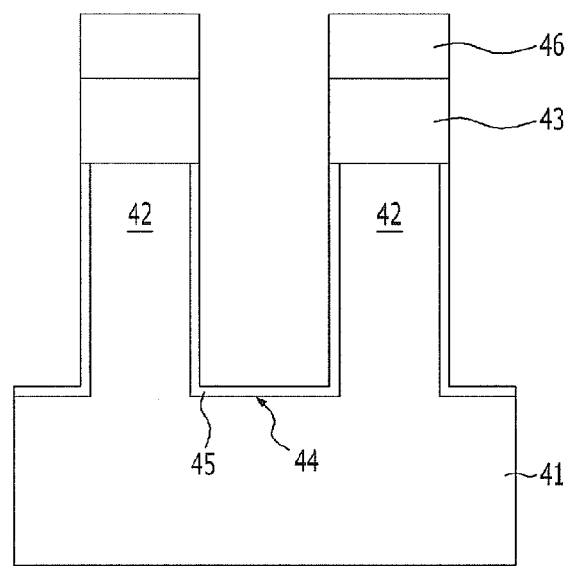
FIGS. 4A to 4E are views illustrating a method for manufacturing a vertical gate transistor in accordance with a second embodiment of the present invention.

Referring to FIG. 4A, a plurality of pillars 42 are formed by etching a semiconductor substrate 41. A hard mask layer 43 is used as an etch barrier to form the pillars 42. The pillars 42 serve as vertical channels. The semiconductor substrate 41 is formed of a silicon-based material. For example, the semiconductor substrate 41 may include a silicon substrate, a silicon-germanium, and a silicon carbide. Accordingly, the pillars become silicon pillars. The pillars 42 become the channels of vertical gate transistors, and in particular, provide vertical channels. The plurality of pillars 42 are separated from one another by a plurality of trenches 44. A dielectric layer such as a silicon nitride layer and a silicon oxide layer may be used as the hard mask layer 43. The hard mask layer 43 may have a multi-layered structure.

Next, a gate dielectric layer 45 is formed on the bottoms of the trenches 44 and the sidewalls of the pillars 42. The gate dielectric layer 45 may be formed through a thermal oxidation process. In another embodiment, the gate dielectric layer 45 may be formed using a deposition method such as CVD (chemical vapor deposition) and ALD (atomic layer deposition). The gate dielectric layer 45 may include a silicon oxide layer ($SiO_2$). The gate dielectric layer 45 may also include a substance with a high dielectric constant.

Figure 5A:
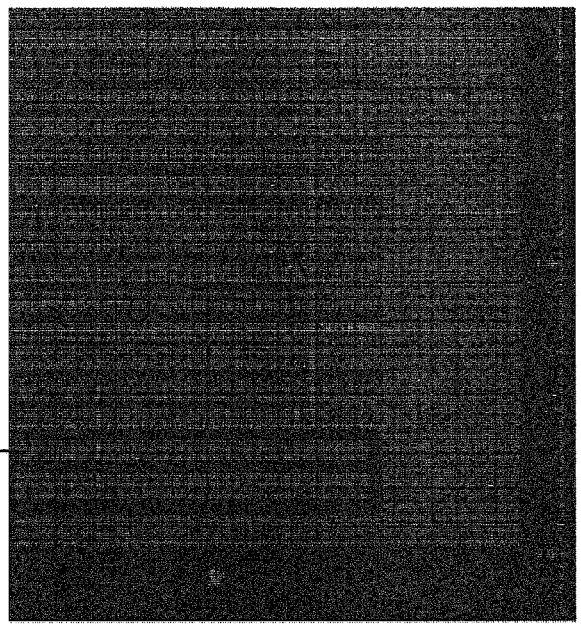
FIG. 5A is a plan view illustrating a pillar in accordance with the second embodiment of the present invention.
Figure 5B:
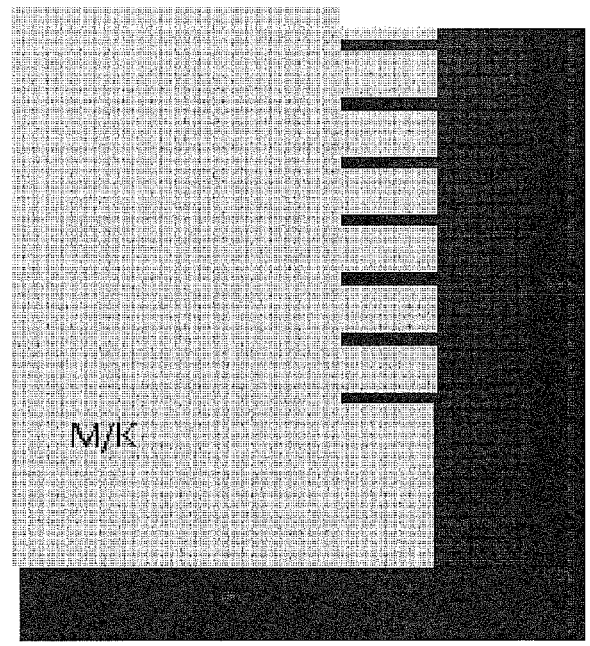
FIG. 5B is a plan view illustrating a mask in accordance with the second embodiment of the present invention.

Subsequently, preliminary photoresist patterns 46 are formed on the hard mask layer 43. The critical dimension of the preliminary photoresist patterns 46 may be the same as the critical dimension of the pillars 42. A separate mask M/K may be employed to selectively open the gate dielectric layer 45 between the pillars. The mask M/K is formed using a photoresist layer. FIG. 5A is a plan view illustrating a pillar in accordance with the second embodiment of the present invention, and FIG. 5B is a plan view illustrating a mask in accordance with the second embodiment of the present invention. Referring to FIG. 5B, the mask M/K opens first side ends of the pillars 42.

Figure 4B:
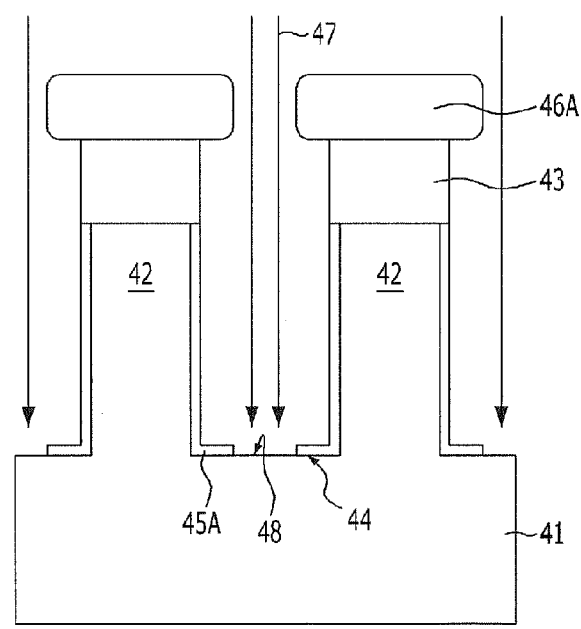

Referring to FIG. 4B, a reflow process is performed. As a result, the critical dimension of the preliminary photoresist patterns 46 increases, and the preliminary photoresist patterns 46A with the increased critical dimension selectively open portions of the gate dielectric layer 45 that are formed on the bottoms of the trenches 44 between the pillars 42. The critical dimension of the photoresist patterns 46A is larger than the critical dimension of the pillars 42.

Subsequently, portions of the gate dielectric layer 45 are etched, as designated by the reference numeral 47, between the pillars 42 by using the photoresist patterns 46A as an etch mask. Thus, portions 48 of the bottoms of the trenches 44 are exposed. The gate dielectric layer that is not etched remains as indicated by the reference numeral 45A.

Figure 4C:
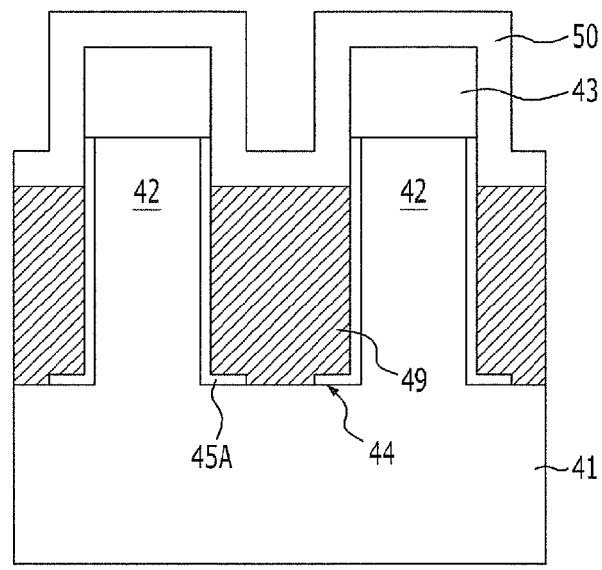

Referring to FIG. 4C, the photoresist patterns 46A are removed.

Next, a conductive layer 49 is formed on the entire surface including the gate dielectric layer 45A. The conductive layer 49 is formed to gap-fill the trenches 44 between the pillars 42 on the gate dielectric layer 45A. Subsequently, a planarization process and an etch-back process are performed. As a result, the conductive layer 49 remains between the pillars 42 while having a height lower than the top surfaces of the pillars 42. The conductive layer 49 is to form gate electrodes, or more specifically, vertical gates, and may include polysilicon or a metal layer. The metal layer may include a titanium nitride layer (TiN), tungsten (W), etc. or may be formed by stacking a titanium nitride layer (TiN) and a tungsten layer (W). Also, the conductive layer 49 may be formed by stacking a barrier metal and a low-resistance metal layer. For example, the conductive layer 49 may be formed by the stack of Ti/TiN/W.

A spacer dielectric layer 50 is formed on the conductive layer 49 to be used as spacers. The spacer dielectric layer 50 may include a nitride layer such as a silicon nitride layer.

Figure 4D:
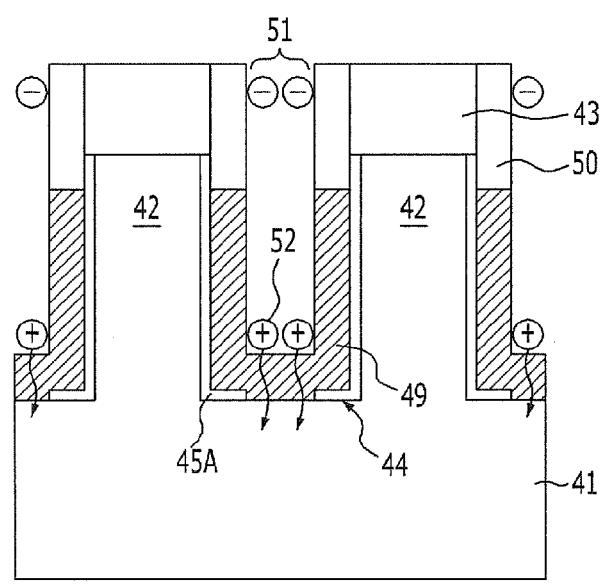
Figure 4E:
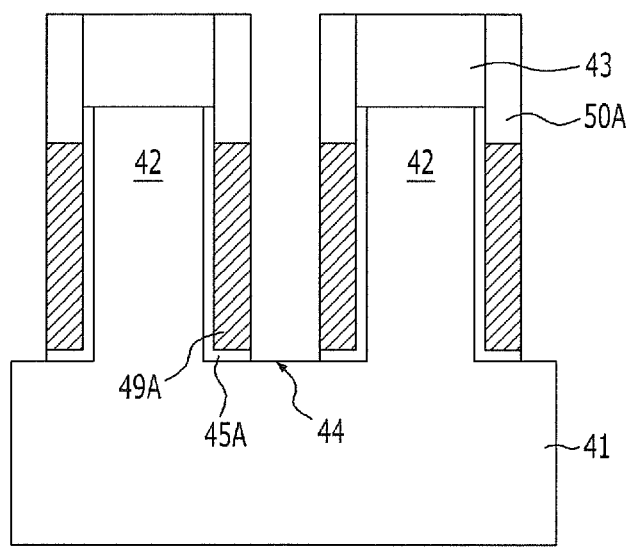

As shown in FIGS. 4D and 4E, spacers 50A are formed by performing spacer etching. Subsequently, gate etching is performed by using the spacers 50A as an etch barrier. For example, the conductive layer 49 is dry-etched using the spacers 50A as an etch barrier. As a result, vertical gates 49A are formed. When etching the conductive layer 49, dry etching, for example, plasma etching is used.

Referring to FIG. 4D, when plasma-etching the conductive layer 49, electron shadowing 51 occurs at the top of the trenches 44 by an ion sheath under a plasma atmosphere. Positive ions 52 move to the bottom of the trenches 44 due to an attractive force. Therefore, damage may occur at the gate dielectric layer 45A as a result of the collection of positive ions 18 at the bottom of the trench 24. In the embodiment of the present invention, since the portions of the gate dielectric layer 45A are removed, ion charging occurring during gate etching is discharged through the bottoms of the trenches 44. Thus, since a charging damage does not occur, a plasma-induced damage (PID) may be prevented.

The vertical gate transistors in accordance with the embodiments of the present invention may be applied to various semiconductor devices such as a cell transistor of a memory cell. For example, the vertical gate transistors in accordance with the embodiments of the present invention may be applied to a DRAM (dynamic random access memory), and further, may be applied to an SRAM (static random access memory), a flash memory, an FeRAM (ferroelectric random access memory), an MRAM (magnetic random access memory), a PRAM (phase change random access memory), etc.

The main product groups of the semiconductor device described above may include computing memories used in a desk top computer, a notebook computer, a server, graphics memories with various specifications, and mobile memories. Also, the semiconductor device may be provided not only to portable storage media such as a memory stick, an MMC, an SD, a CF, an xD picture card, and a USB flash device but also to various digital applications such as an MP3P, a PMP, a digital camera, a camcorder, and a mobile phone. Also, the semiconductor device may be applied not only to a single product of a semiconductor device but also to an MCP (multi-chip package), a DOC (disk on chip), and an embedded device. Moreover, the semiconductor device may be applied to a CIS (CMOS image sensor) to be supplied to various fields such as of a camera phone, a web camera, and a small-sized medical photographing device.

As is apparent from the above descriptions, according to the embodiments of the present invention, since implant damage is intentionally formed in a portion of a gate dielectric layer through ion implantation, ion charging may be avoided when subsequently etching a gate. As a result, since ions are discharged through the implant damage of the gate dielectric layer that is formed through ion implantation, a charging damage is not caused.

As a result, when a three-dimensional structure is formed according to the embodiments of the present invention, plasma-induced damage (PID) may be prevented from occurring in the gate dielectric layer, and a semiconductor device with improved reliability may be manufactured.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a semiconductor device, comprising:
   forming a plurality of pillars by etching a semiconductor substrate;
   forming a gate dielectric layer on sidewalls of the plurality of pillars and on surfaces of the semiconductor substrate between the plurality of pillars, thereby forming first portions of the gate dielectric layer and second portions of the gate dielectric layer, respectively;

forming implant damages in the second portions of the gate dielectric layer by implanting ions into the second portions of the gate dielectric layer;

forming vertical gates to cover the sidewalls of the plurality of pillars; and removing the implant damages.

2. The method of claim 1, wherein the forming of the implant damages is implemented through directional ion implantation.

3. The method of claim 1, wherein the forming of the implant damages is implemented by using an ion implantation mask which opens first side ends of the plurality of pillars.

4. The method of claim 1, wherein the forming of the implant damages is implemented by using any one of an inactive element, a third group element, and a fifth group element as a dopant.

5. The method of claim 1, wherein the forming of the implant damages is implemented by using any one of Ne, Ar, Kr, Xe, Rn, B, P, As, and Sb as a dopant.

6. A method for manufacturing a semiconductor device, comprising:

forming a plurality of pillars by etching a semiconductor substrate;

forming a gate dielectric layer on sidewalls of the plurality of pillars and on surfaces of the semiconductor substrate between the plurality of pillars, thereby forming first portions of the gate dielectric layer and second portions of the gate dielectric layer, respectively;

forming a conductive layer that gap-fills trenches between the plurality of pillars, wherein an upper surface of the conductive layer is formed to a height lower than those of upper surfaces of the plurality of pillars;

forming a spacer dielectric layer on an entire surface including the conductive layer and the plurality of pillars;

forming an implant damages in the second portions of the gate dielectric layer by implanting ions into the second portions of the gate dielectric layer;

forming vertical gates by sequentially performing etching of the spacer dielectric layer and etching of the conductive layer; and removing the implant damages.

7. The method of claim 6, wherein the forming of the implant damages comprises:

implementing ions through the conductive layer into the second portions of the gate dielectric layer.

8. The method of claim 6, wherein the forming of the implant damages is implemented through directional ion implantation.

9. The method of claim 6, wherein the forming of the implant damages is implemented by using an ion implantation mask which opens first side ends of the plurality of pillars.

10. The method of claim 6, wherein the forming of the implant damages is implemented by using any one of an inactive element, a third group element, and a fifth group element as a dopant.

11. The method of claim 6, wherein the forming of the implant damages is implemented by using any one of Ne, Ar, Kr, Xe, Rn, B, P, As, and Sb as a dopant.

12. The method of claim 6, wherein, in the forming of the vertical gates, the etching of the conductive layer is performed through an etching using plasma.

13. The method of claim 6, wherein the conductive layer comprises a metal layer.

14. A method for manufacturing a semiconductor device, comprising:

forming a plurality of pillars by etching a semiconductor substrate;

forming a gate dielectric layer on sidewalls of the plurality of pillars and on surfaces of the semiconductor substrate between the plurality of pillars, thereby forming first portions of the gate dielectric layer and second portions of the gate dielectric layer, respectively;

removing the second portions of the gate dielectric layer;

forming a conductive layer that gap-fills trenches between the plurality of pillars, wherein an upper surface of the conductive layer is formed to a height lower than those of upper surfaces of the plurality of pillars;

forming a spacer dielectric layer on an entire surface including the conductive layer and the plurality of pillars; and forming vertical gates by sequentially performing etching of the spacer dielectric layer and etching of the conductive layer.

15. The method of claim 14, wherein the removing of the second portions of the gate dielectric layer comprises:

forming photoresist patterns on the plurality of pillars;

reflowing the photoresist patterns;

etching the second portions of the gate dielectric layer by using the reflowed photoresist patterns as a mask; and removing the photoresist patterns.

16. The method of claim 15, wherein the photoresist patterns have a shape that opens first side ends of the plurality of pillars.

17. The method of claim 14, wherein, in the forming of the vertical gates, the etching of the conductive layer is performed through an etching using plasma.

18. The method of claim 14, wherein the conductive layer comprises a metal layer.

* * * * *